March 5, 1957 R. P. CROW 2,784,262
TRANSISTOR AMPLIFIER
Filed Dec. 15, 1953
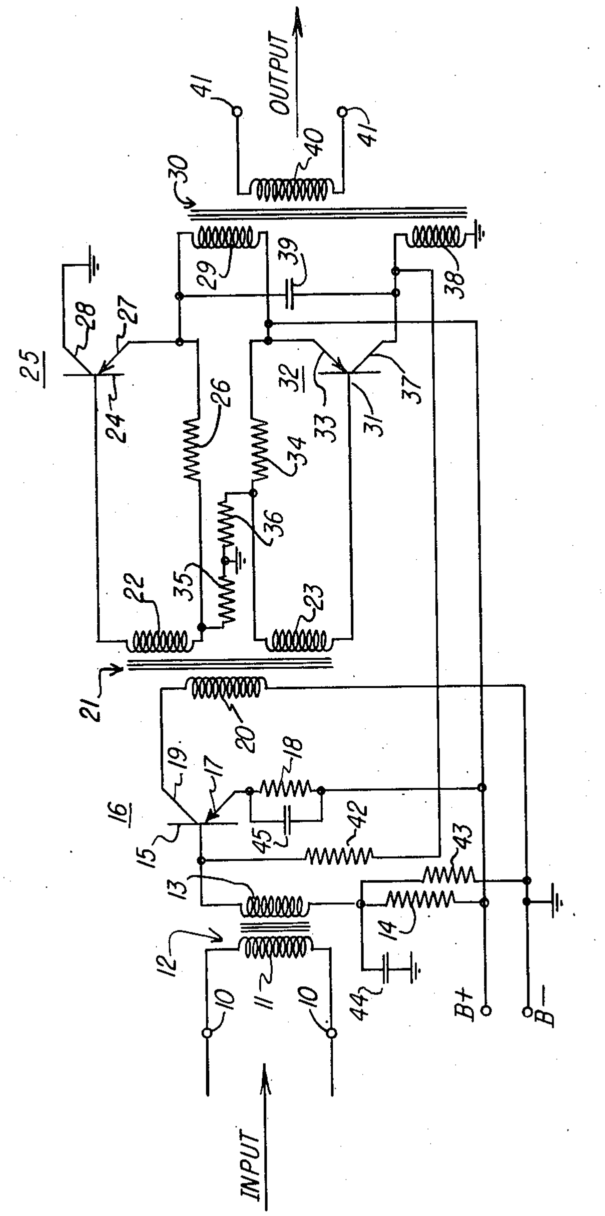
INVENTOR.
Robert P. Crow
BY Mueller & Aichele
Attys.

United States Patent Office 2,784,262

Patented Mar. 5, 1957

2,784,262

TRANSISTOR AMPLIFIER

Robert P. Crow, Park Ridge, Ill., assignor to Motorola, Inc., Chicago, Ill., a corporation of Illinois Application December 15, 1953, Serial No. 398,363

7 Claims. (Cl. 179—171)

This invention relates to amplifiers, and more particularly to an improved amplifier using transistor units and which is especially suited for the high quality amplification of audio signals.

It is desirable for most purposes, and usually essential for the amplification of audio signals, that the amplifier will faithfully translate the signals without introducing appreciable distortions therein. For this reason, push-pull amplifiers have been widely used for the amplification of audio signals because such amplifiers are connected to cancel even order harmonics produced by non-linear characteristics of the discharge devices used therein. Negative feedback amplifiers have also been used for high quality audio amplification since such amplifiers also tend to reduce the distorting effects of non-linearity of the discharge devices. Moreover, for highest quality amplification of audio signals, a combination of the two types of amplifiers described above is often used.

Push-pull amplifiers, however, often exhibit certain inherent disadvantages due to imperfections in the output transformer necessary to couple the high impedance push-pull output of such amplifiers to a low impedance single-ended load. In most output transformers, it has been found that there is insufficient coupling between the two portions of the primary windings at the higher audio frequencies, and the resulting leakage reactance introduces distortion for these higher frequencies. The negative feedback amplifier also has a tendency to introduce distortions at the higher audio frequencies due to undesired phase shifts in the feedback path.

The above disadvantages are discussed in an article by Peterson and Sinclair commencing at page 7 of the January 1952 edition of "Proceedings of the Institute of Radio Engineers." This article also discloses various arrangements for overcoming these disadvantages. Specifically, the article describes a single-ended push-pull amplifier arrangement using electron tubes that may include a degenerative feedback path and which has all the advantages of the push-pull and negative feedback amplifier, but in which undesired phase shifts and their effect on the feedback are minimized and imperfections of the output transformer have little or no distorting effect on the signals translated thereby.

The present invention provides an amplifier that operates on a principle similar to the general principles of the systems disclosed in that article, but which is modified and adapted to utilize transistor units so as to derive the resulting benefits inherent in the use of such units.

It is, accordingly, the object of the present invention to provide an improved amplifier circuit of the transistor type which is capable of translating input signals applied thereto without the introduction of any appreciable distortion into such signals during the translation thereof.

A further object of the invention is to provide such an improved transistor amplifier circuit that is relatively simple to construct and which entails relatively few and inexpensive components.

A feature of the invention is the provision of an improved and simplified push-pull transistor amplifier circuit having a single-ended output, and which is connected in an improved and simplified manner so that appropriate bias potentials are applied to the various electrodes of the transistor units utilized therein.

The above and other features of the invention, which are believed to be new, are set forth with particularity in the appended claims. The invention itself, however, together with further objects and advantages thereof, may best be understood by reference to the following description when taken in conjunction with the accompanying drawing, in which the single figure shows one embodiment of the transistor amplifier of the present invention.

The invention provides a transistor amplifier which comprises first and second transistor units, each having a first electrode connected to a source of biasing potential, a second electrode connected to a point of reference potential, and a third electrode. Two biasing networks are provided and these are respectively connected between the first electrodes of the transistor units and the point of reference potential, and the biasing networks each have a tap thereon connected to respective ones of the third electrodes. Input circuit means is provided for impressing signals to be amplified between the first and third electrodes of the transistor units in phase opposition with respect to one another for push-pull operation of the units. The amplifier includes a single-ended output circuit having a transformer with a first primary winding interposed between the first electrode of the first transistor unit and the source of biasing potential and with a second primary winding interposed between the second electrode of the second transistor unit and the point of reference potential.

The circuit illustrated in the drawing includes a pair of input terminals 10 which are connected to the primary winding 11 of a coupling transformer 12. One side of the secondary winding 13 of transformer 12 is connected through a dropping resistor 14 to the positive terminal B+ of a source of unidirectional biasing potential, the negative terminal of which is connected to a point of reference potential or ground. This side of the secondary winding is also connected to ground through a resistor 43 and is by-passed to ground through a capacitor 44. The other side of the secondary winding 13 is connected to the base electrode 15 of a transistor 16, the transistor being connected as a driver stage. The emitter electrode 17 of transistor 16 is connected to the positive terminal B+ through a resistor 18, and the resistor is shunted by a capacitor 45. The collector electrode 19 of the transistor is connected to ground through the primary winding 20 of a coupling transformer 21. Resistors 14, 43 are connected as a potentiometer across the biasing potential source and stabilize the potential on base electrode 15.

Transformer 21 has a pair of secondary windings 22—23. The upper side of secondary winding 22 is connected to the base electrode 24 of a transistor 25 and the lower side of this winding is connected through a resistor 26 to the emitter electrode 27 of that transistor. The collector electrode 28 of transistor 25 is directly connected to ground, and the emitter electrode 27 is further connected to the positive terminal B+ through the primary winding 29 of an output transformer 30.

The other secondary winding 23 of transformer 21 has its lower side connected to the base electrode 31 of a transistor 32, and the upper side of this winding is connected to the emitter electrode 33 of that transistor through a resistor 34. The lower side of winding 22 is connected to the upper side of winding 23 through a pair of series resistors 35—36, and the common junction of these resistors is connected to ground.

The emitter electrode 33 of transistor 32 is directly connected to the positive terminal B+, and the collector electrode 37 of that transistor is connected through a second primary winding 38 of transformer 30 to ground.

The upper side of winding 29 is coupled to the upper side of winding 38 through a capacitor 39. The secondary winding 40 of output transformer 30 is connected to output terminals 41.

A negative feedback connection is taken from ungrounded side of winding 38 and connected through a resistor 42 to base electrode 15 of transistor 16 in the driver stage. When so desired, and depending upon the polarity of the biasing potentials used in the system, this feedback connection could be taken from the upper side of primary winding 29 of output transformer 30.

Audio or other signals impressed upon input terminals 10 are amplified by the driver stage of transistor 16 in well-known manner, and the amplified signals are applied to primary winding 20 of transformer 21. These signals, therefore, appear across each of the secondary windings 22—23 of this transformer. The signals appearing across secondary winding 22 are applied between the base and emitter electrodes of transistor 25, and the signals appearing across secondary winding 23 are applied between the base and emitter electrodes of transistor 32 in opposite phase for push-pull operation of the transistors.

As previously pointed out, the collector electrode of transistor 25 is grounded, and the first primary winding 29 of output transformer 30 is interposed in the emitter circuit of that transistor and constitutes a load for the transistor. The emitter electrode of transistor 32, on the other hand, is directly connected to the positive terminal B+ and the second primary winding 38 of transformer 30 is connected in the collector electrode circuit of that transistor to constitute a load for the latter transistor.

The emitter electrode 27 of transistor 25 receives positive bias from terminal B+ through winding 29, and the base electrode 24 of this transistor is biased less positively by the potentiometer connection of resistors 26 and 35, whose common junction is connected to base 24 through winding 22.

In the illustrated embodiment, transistor 25 is of the PNP type and is biased in the manner described above for class "A" or class "AB" operation. Likewise, the emitter electrode 33 of transistor 32 receives positive bias directly from terminal B+, and the base electrode 31 of this transistor receives a lower positive bias due to the potentiometer connection with resistors 34 and 36, whose common junction is connected to base electrode 31 through winding 23. Therefore, transistor 32, which is also a PNP type, is suitably biased for class "A" or class "AB" operation. Resistors 26 and 34 may be replaced by direct connections and resistors 35 and 36 eliminated when class "B" operation is desired, and, with the latter connection, the base and emitter electrodes of both transistors are biased to cut off in the absence of signals.

With the illustrated connections, the DC current in the transistors flows in opposite directions through the first and second primary windings 29 and 38 of output transformer 30, and these windings are effectively connected in parallel for the signals translated by the amplifier. The signals in winding 29 are in phase with the signals in winding 38, since one of these windings is included in the emitter circuit of one of the transistors, and the other winding is included in the collector circuit of the other transistor, since the signals are applied to the transistors in push-pull phase. Therefore, the signals add in the output transformer and appear across secondary winding 40 and across output terminals 41. Thus a single-ended output is obtained with all of the advantages accruing therefrom.

Since the two primary windings of the transformer are in parallel, its design is not critical because the high frequency distorting effects of leakage reactance can be eliminated by increasing the effective coupling between the windings by capacitor 39. This capacitor can be dispensed with, however, when bi-filar windings are used in the output transformer.

The negative feedback connection from winding 38 to the base electrode 15 of transistor 16 in the driver stage further stabilizes the amplifier and eliminates distortion therein. Since the output is single-ended, the feedback can be made from the primary winding of the output transformer. This removes the secondary winding of the transformer from the feedback path, and the undesired phase shifts of high and low signal frequencies which occur in the output transformer are greatly reduced.

In a constructed embodiment of the invention, the following values were used, and these are listed herein merely by way of example and are not intended to limit the invention in any manner:

| | | |
|---|---|---|
| Resistor 35 | ohms | 1,800 |
| Resistor 26 | do | 47 |
| Resistor 36 | do | 1,800 |
| Resistor 34 | do | 47 |
| Resistor 42 | do | 10,000 |
| B+ | volts | 6 |
| Capacity (39) | micro-farads | 100 |

The invention provides, therefore, an improved transistor unit for high quality distortionless signal amplification; and which amplifier uses transistors that are connected in an improved and simplified manner so that suitable biasing potentials may be applied to the transistors for the proper operation thereof.

While a particular embodiment of the invention has been shown and described, modification may be made and it is intended in the appended claims to cover such modifications as fall within the true spirit and scope of the invention.

I claim:

1. A transistor amplifier including in combination, first and second transistor units each having an emitter electrode connected to a source of biasing potential, a collector electrode connected to a point of reference potential, and a base electrode; a pair of biasing networks respectively connected between said emitter electrodes of said first and second transistor units and said point of reference potential, and each of said biasing networks having a tap thereon connected to respective ones of said base electrodes; input circuit means for impressing signals to be amplified between said emitter and base electrodes of said transistor units in phase opposition with respect to one another for push-pull operation of said transistor units; and a single-ended output circuit for the amplifier including a transformer having a first primary winding interposed between said emitter electrode of said first transistor unit and said source of biasing potential, and said transformer having a second primary winding interposed between said collector electrode of said second transistor unit and said point of reference potential.

2. A transistor amplifier including in combination, first and second transistor units each having an emitter electrode connected to a source of biasing potential, a collector electrode connected to a point of reference potential, and a base electrode; a pair of biasing networks each including a pair of series-connected resistors connected between the respective emitter electrodes and said point of reference potential, with the common junction of said resistors being connected to the respective base electrodes; input circuit means for impressing signals to be amplified between said emitter and base electrodes of said transistor units in phase opposition with respect to one another for push-pull operation of said transistor units; and a single-ended output circuit for the amplifier including a transformer having a first primary winding interposed between said emitter electrode of said first transistor unit and said source of biasing potential, and said transformer having a second primary winding interposed between said collector electrode of said second transistor unit and said point of reference potential.

3. A transistor amplifier including in combination, first and second transistor units each having an emitter electrode connected to a source of positive biasing potential, a collector electrode connected to a point of reference potential, and a base electrode; a pair of biasing networks each including a pair of series-connected resistors connected between the respective emitter electrodes and said point of reference potential, with the common junction of said resistors being connected to the respective base electrodes; input circuit means for impressing signals to be amplified between said emitter and base electrodes of said transistor units in phase opposition with respect to one another for push-pull operation of said transistor units, said input circuit means including an input transformer having first and second secondary windings respectively interposed between said base electrodes of said transistor units and said biasing networks; and a single-ended output circuit for the amplifier including a transformer having a first primary winding interposed between said emitter electrode of said first transistor unit and said source of biasing potential; and said transformer having a second primary winding interposed between said collector electrode of said second transistor unit and said point of reference potential.

4. A transistor amplifier including in combination, first and second transistor units each having an emitter electrode connected to the source of biasing potential, a collector electrode connected to a point of reference potential, and a base electrode; a pair of biasing networks, each including a pair of series-connected resistors connected between the respective emitter electrodes and said point of reference potential, with the common junction of said resistors being connected to the respective base electrodes; input circuit means for impressing signals to be amplified between said emitter and base electrodes of said transistor units in phase opposition with respect to one another for push-pull operation of said transistor units; a transistor driver stage coupled to said input circuit for impressing the signal to be amplified on said input circuit; a single-ended output circuit for the amplifier including an output transformer having a first primary winding interposed between said emitter electrode of said first transistor unit and said source of biasing potential, and said transformer having a second primary winding interposed between said collector electrode of said second transistor unit and said point of reference potential; and a degenerative feedback circuit connected to one of said primary windings of said output transformer and to said driver stage.

5. A transistor amplifier including in combination, first and second transistor units each having an emitter electrode connected to a source of biasing potential, a collector electrode connected to a point of reference potential, and a base electrode; input circuit means for impressing signals to be amplified between said emitter and base electrodes of said transistor units in phase opposition with respect to one another for push-pull operation of said transistor units; and a single-ended output circuit for the amplifier including a transformer having a first primary winding interposed between said emitter electrode of said said first transistor unit and said source of biasing potential, and said transformer having a second primary winding interposed between said collector electrode of said second transistor unit and said point of reference potential.

6. A transistor amplifier including in combination, first and second transistor units each having an emitter electrode connected to a source of biasing potential, a collector electrode connected to a point of reference potential, and a base electrode; input circuit means for impressing signals to be amplified between said emitter and base electrodes of said transistor units in phase opposition with respect to one another for push-pull operation of said transistor units; and a single-ended output circuit for the amplifier including a first output circuit portion having a first output winding interposed between said emitter electrode of said first transistor unit and said source of biasing potential, and a second output circuit portion having a second output winding interposed between said collector electrode of said second transistor unit and said point of reference potential, said output circuit including means intercoupling said first and second output circuit portions, whereby signals from each of said first and second transistor units are applied to both of said output windings.

7. A transistor amplifier including in combination, first and second transistor units each having an emitter electrode, a collector electrode, and a base electrode, bias means including a point of reference potential and a point at a direct current potential with respect to said reference potential, input circuit means for impressing signals to be amplified between said emitter and base electrodes of said transistor units in phase opposition with respect to one another for push-pull operation of said transistor units, and a single-ended output circuit for the amplifier including a first output circuit portion having a first output winding interposed between said emitter electrode of said first transistor unit and said point at a direct current potential, and a second output circuit portion having a second output winding interposed between said collector electrode of said second transistor unit and said point of reference potential, said output circuit including means connecting said emitter and collector electrodes of said first and second transistor units to said bias means for providing biases of the same polarity between said emitter and collector electrodes of said first and second transistor units, and said output circuit including means intercoupling said first and second output circuit portions, whereby signals from each of said first and second transistor units are applied to both of said output windings.

References Cited in the file of this patent

UNITED STATES PATENTS

| | | |
|---|---|---|
| 2,648,727 | Rockwell | Aug. 11, 1953 |
| 2,662,123 | Koenig | Dec. 8, 1953 |
| 2,680,160 | Yaeger | June 1, 1954 |

OTHER REFERENCES

Bell text "The Transistor," pp. 161, 355, 356, 373; pub. 1951 by Bell Tel. Laboratories, Murray Hill, New Jersey.